United States Patent [19]

Kata et al.

[11] Patent Number: 5,897,337
[45] Date of Patent: Apr. 27, 1999

[54] PROCESS FOR ADHESIVELY BONDING A SEMICONDUCTOR CHIP TO A CARRIER FILM

[75] Inventors: Keiichiro Kata; Shuichi Matsuda, both of Tokyo, Japan

[73] Assignee: NEC Corporation, Tokyo, Japan

[21] Appl. No.: 08/533,205

[22] Filed: Sep. 25, 1995

[30] Foreign Application Priority Data

Sep. 30, 1994 [JP] Japan .................................. 6-238040

[51] Int. Cl.⁶ .......................... H01L 21/283; H01L 21/58; H01L 21/60
[52] U.S. Cl. .......................... 438/114; 438/115; 438/118; 438/460; 438/613; 438/667; 438/686
[58] Field of Search .................................. 438/114, 115, 438/118, 460, 613, 666, 667, 686, 906, 940, 975, FOR 343, FOR 361, FOR 363, FOR 365, FOR 370, FOR 386, FOR 403

[56] References Cited

U.S. PATENT DOCUMENTS

| | | |
|---|---|---|
| 4,887,760 | 12/1989 | Yoshino et al. . |
| 5,030,308 | 7/1991 | Sheyon et al. . |
| 5,105,820 | 4/1992 | Moriuchi et al. . |
| 5,151,769 | 9/1992 | Immorlica, Jr. et al. . |
| 5,286,679 | 2/1994 | Farnworth et al. . |
| 5,350,947 | 9/1994 | Takekawa et al. . |
| 5,434,751 | 7/1995 | Cole, Jr. et al. . |
| 5,478,007 | 12/1995 | Marrs . |

FOREIGN PATENT DOCUMENTS

| | | |
|---|---|---|
| 55-130133 | 10/1980 | Japan . |
| 57112038 | 7/1982 | Japan . |
| 0291944 | 3/1990 | Japan . |

OTHER PUBLICATIONS

European Search Report, dated Jul. 4, 1997.

*Primary Examiner*—David Graybill
*Attorney, Agent, or Firm*—Whitham, Curtis & Whitham

[57] ABSTRACT

In a method of manufacturing a semiconductor device comprising a semiconductor chip and a carrier film which includes an insulating film and wiring patterns formed on one of main surfaces of the insulating film, an adhesive layer is formed on a surface of a semiconductor wafer having a number of integrated circuits. Each of the integrated circuits has electrode pads for external connection on the foregoing surface of the semiconductor wafer. Subsequently, openings are formed at regions of the adhesive layer corresponding to the electrode pads, and then, the semiconductor wafer is cut per integrated circuit so as to obtain the semiconductor chips. Thereafter, the electrode pads of the semiconductor chip and the wiring patterns of the carrier film are connected to each other through the corresponding openings of the adhesive layer, respectively. Then, the semiconductor chip and the carrier film are bonded together via the adhesive layer interposed therebetween. It may be arranged that the adhesive layer is formed on the carrier film rather than on the semiconductor chip.

20 Claims, 14 Drawing Sheets

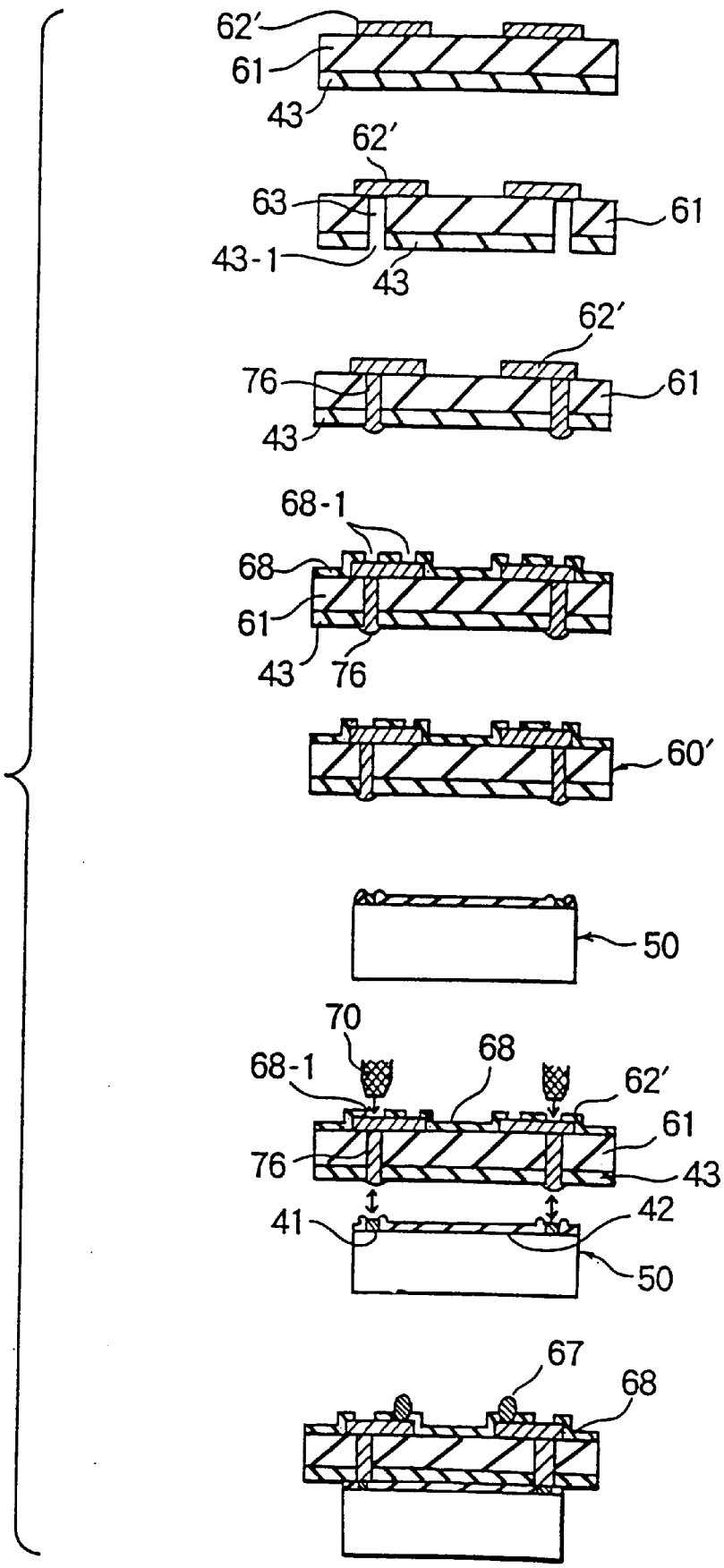

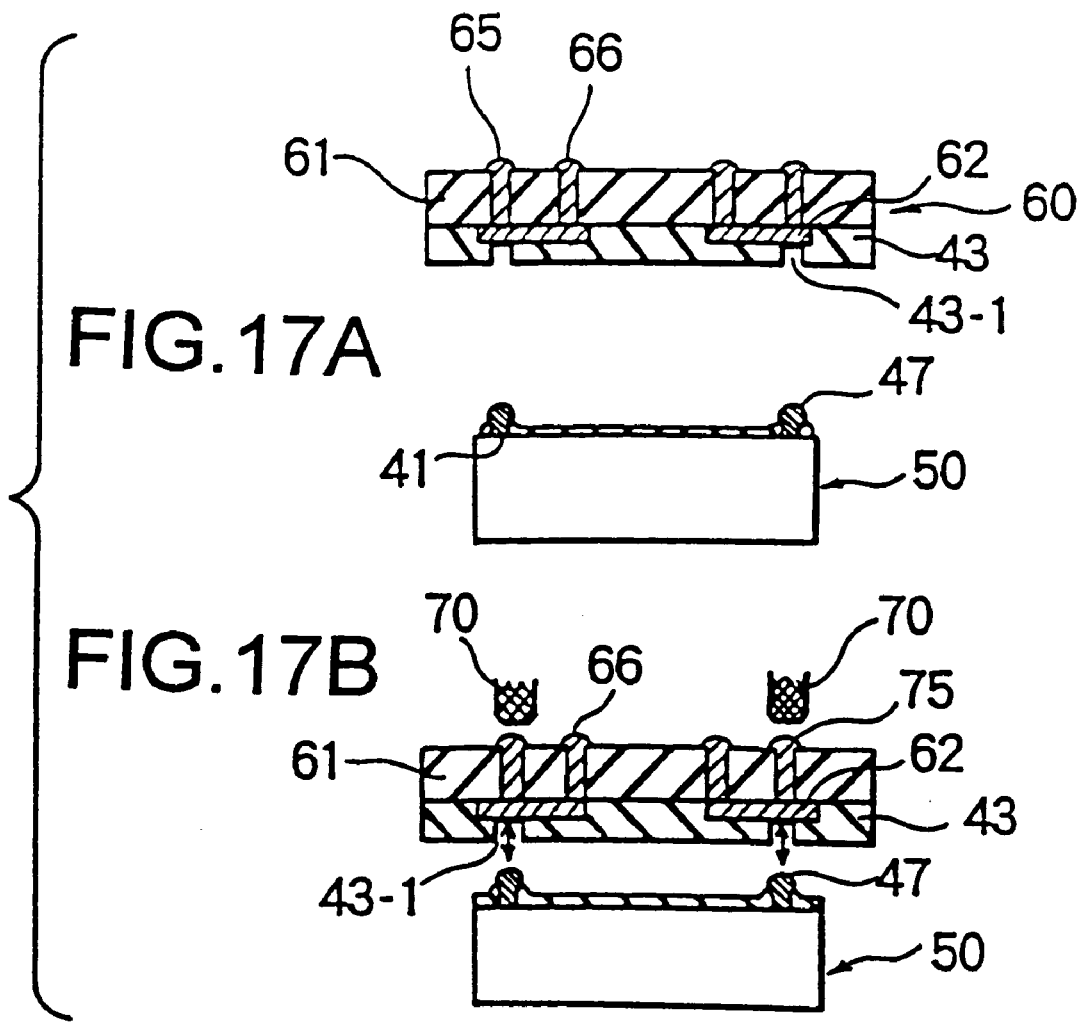

PROCESS FOR ADHESIVELY BONDING A SEMICONDUCTOR CHIP TO A CARRIER FILM

BACKGROUND OF THE INVENTION

1. Field of the Invention

The present invention relates to a method of manufacturing a semiconductor device, and more specifically, to a method of manufacturing a semiconductor device, called a chip-size package, which is suitable for high-density packaging.

2. Description of the Prior Art

Various types of semiconductor devices have been developed for satisfying demands to electronic devices, such as, reduction in size and weight, speed-up and multi-functionalization thereof. Demands for increasing the number of pins due to the high integration of the semiconductor chips and for reduction in size and thickness of the semiconductor devices have been getting stronger so that the fine-pitch arrangement of the pins is essential for satisfying both demands. Thus, it is considered that the inner-lead connection which can narrow pitches of the pins and the area-array connection which can enlarge pitches of the pins, be the essential techniques.

A chip-size package-type semiconductor device is in the form of a semiconductor chip and a carrier film which are integrally bonded by means of an adhesive film. One side of the semiconductor chip, which is attached to the carrier film, is formed with a plurality of electrode pads along the edge thereof. On the other hand, the carrier film includes an organic insulating film and wiring layers formed on the organic insulating film. Each of the wiring layers includes a region for connection to the corresponding electrode pad of the semiconductor chip. Further, a plurality of bump electrodes are formed as electrode pads of the carrier film for connection to the exterior. The bump electrodes are arranged in a grid at regular pitches and distributed widely on a side of the organic insulating film remote from the wiring layers. The wiring layers are provided on a side of the carrier film facing the semiconductor chip. Each of the wiring layers has one end connected to the corresponding bump electrode through a via hole which is formed by filling a metal material into a through hole formed at the organic insulating film. Other through holes are further formed at the carrier film, and the metal material is filled into these other through holes so as to form via holes, each for connection between the wiring layer and the electrode pad as inner leads. Each via hole is adjustable in position, when formed, relative to the electrode pad and the wiring layer. The inner-lead connection of the electrode pad and the wiring layer is achieved through this via hole.

The chip-size package-type semiconductor device is, in general, fabricated in the following manner:

After temporarily attaching the adhesive film to either one of the semiconductor chip and the carrier film, the electrode pads and the wiring layers are electrically connected to each other. Subsequently, the adhesive film is bonded to the other of the semiconductor chip and the carrier film by applying heat and pressure. Thus, a size of the adhesive film is limited to a size corresponding to an area defined within the electrode pads, that is, not corresponding to all the area of the joint surface of the semiconductor chip, so as to avoid overlapping the electrode pads.

However, in such a fabricating method, setting or positioning of the adhesive film relative to the semiconductor chip is difficult. Further, since the adhesive film is not interposed between the semiconductor chip and the carrier film at regions along the edge of the semiconductor chip, sealing therebetween tends to be insufficient. When the sealing is insufficient, moisture proof is deteriorated, thus leading to insulation failure and further to reduction in life duration of the semiconductor device.

Further, in this kind of the chip-size package-type semiconductor device, it is important that a diameter of each of the through holes formed at the organic insulating film be set as small as possible for rendering a pitch of the bump electrodes 24 as small as possible. In general, the through hole is formed by the chemical etching or the laser processing using the excimer (KrF) laser. The excimer laser is used because it is difficult to achieve the fine processing using the well-known YAG laser. However, it is also difficult to achieve the fine processing even using the chemical etching, and further, although the excimer laser can achieve the fine processing, its oscillating tube is expensive and its maintenance cost is high so that it is difficult to use the excimer laser.

Under these circumstances, in the conventional processing method, a diameter of the through hole is 50 μm at minimum. Further, a shape of the through hole is tapered. Thus, narrowing of the pitches of the through holes is limited.

SUMMARY OF THE INVENTION

It is an object of the present invention to provide a method of manufacturing a semiconductor device which can reliably achieve sealing at a joint portion between a semiconductor chip and a carrier film.

It is another object of the present invention to provide a method of manufacturing a semiconductor device which can ensure electrical connection between an electrode pad of a semiconductor chip and a wiring layer of a carrier film so as to improve durability of the device.

It is another object of the present invention to provide a method of manufacturing a semiconductor device which can easily realize, at a low cost, a bump electrode necessary for a carrier film for connection to the exterior.

It is another object of the present invention to provide a method of manufacturing a semiconductor device which can achieve narrowing of pitches of a number of through holes formed at a carrier film.

According to one aspect of the present invention, a method of manufacturing a semiconductor device comprising a semiconductor chip and a carrier film which includes an insulating film and wiring patterns formed on one of main surfaces of the insulating film, comprises the steps of: forming an adhesive layer on a surface of a semiconductor wafer having a number of integrated circuits, the integrated circuits each having electrode pads for external connection on the surface of the semiconductor wafer; forming a first group of openings at regions of the adhesive layer corresponding to the electrode pads; cutting the semiconductor wafer per integrated circuit so as to obtain the semiconductor chip; connecting between the electrode pads of the semiconductor chip and the wiring patterns of the carrier film through the first group of openings, respectively; and bonding the semiconductor chip and the carrier film together via the adhesive layer.

According to another aspect of the present invention, a method of manufacturing a semiconductor device comprising a semiconductor chip with electrode pads on a surface thereof and a carrier film which includes an insulating film and wiring patterns formed on one of main surfaces of the insulating film, comprises the steps of: forming an adhesive layer over all the area of the surface of the semiconductor chip or on a region of the carrier film corresponding to the all the area of the surface of the semiconductor chip; forming a first group of openings at regions of the adhesive layer corresponding to the electrode pads; connecting between the electrode pads of the semiconductor chip and the wiring patterns of the carrier film through the first group of openings, respectively; and bonding the semiconductor chip and the carrier film together via the adhesive layer.

BRIEF DESCRIPTION OF THE DRAWINGS

The present invention will be understood more fully from the detailed description given hereinbelow, taken in conjunction with the accompanying drawings.

In the drawings:

FIGS. 16(a) to 16(g) are diagrams for explaining a modification of the second preferred embodiment;

FIGS. 17(a) and 17(b) are diagrams for explaining another modification of the second preferred embodiment.

DESCRIPTION OF THE PREFERRED EMBODIMENT

In order to facilitate understanding of the present invention, a conventional method of manufacturing a chip-size package-type semiconductor device will be first explained hereinbelow with reference to FIGS. 1 and 2.

Figure 1:
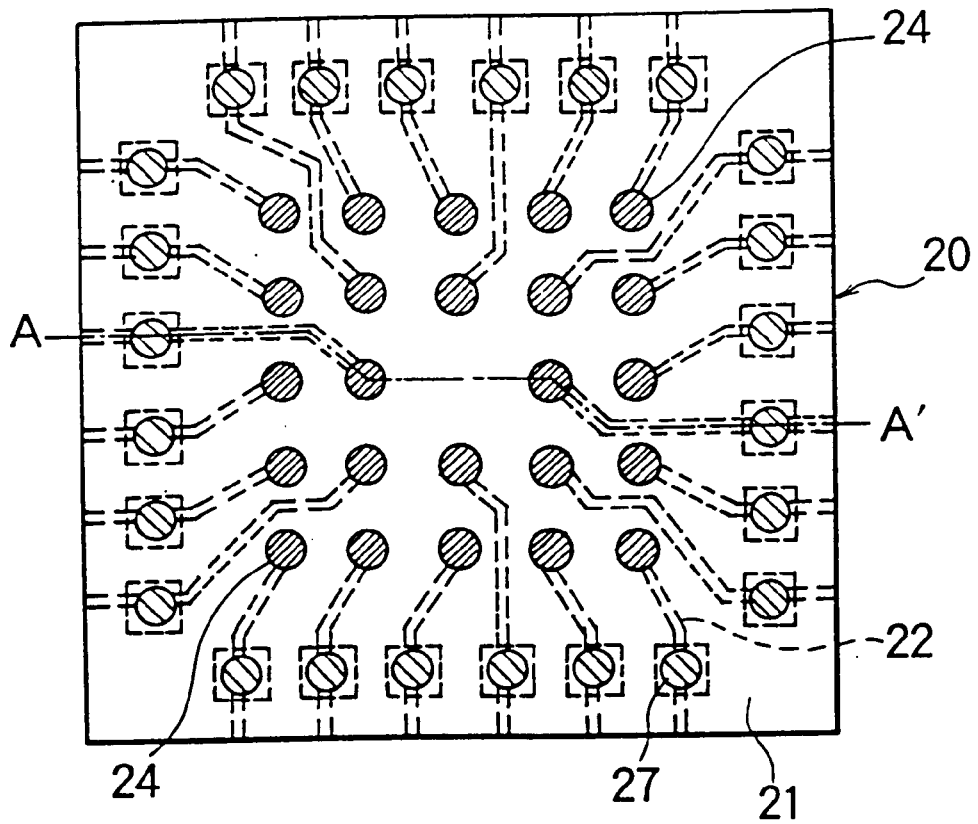
FIG. 1 is a plan view, seen from a carrier film side, of a conventional semiconductor device.
Figure 2:
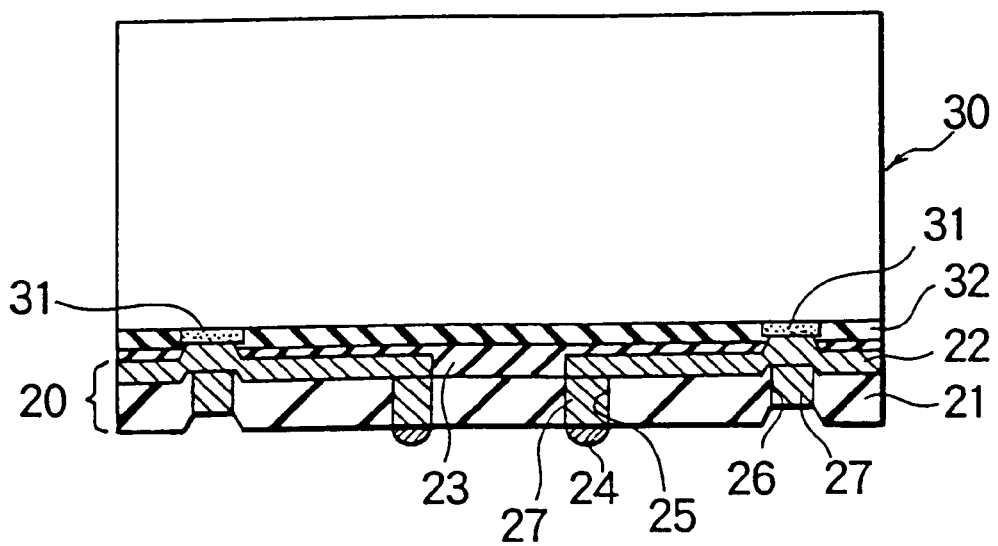
FIG. 2 is a sectional view taken along line A—A' in FIG. 1.

In FIGS. 1 and 2, the semiconductor device includes a carrier film 20 having an organic insulating film 21 and wiring layers 22 formed on the organic insulating film 21. A material of the organic insulating film 21 may be polyimide resin or the like. The wiring layers 22 are formed by processing, such as etching, a metal foil of copper or the like into desired shapes. Each wiring layer 22 is formed with a region for connection to a corresponding electrode pad 31 of a semiconductor chip 30.

The semiconductor chip 30, although its internal structure is not shown, has a surface bonded to the carrier film 20. On this surface, a plurality of the electrode pads 31 are formed along the edge thereof, and further, a passivation film 32 is formed except at the regions of the electrode pads 31. The semiconductor chip 30 and the carrier film 20 are bonded together by means of an adhesive film 23. Further, a plurality of bump electrodes 24 are formed as electrode pads of the carrier film 20 for connection to the exterior. A material of the bump electrode 24 may be solder or the like. As shown in FIG. 1, the bump electrodes 24 are arranged in a grid at regular pitches and distributed widely on a side of the organic insulating film 21 remote from the wiring layers 22. The wiring layers 22 are provided on a side of the carrier film 20 facing the semiconductor chip 30. Each of the wiring layers 22 has one end connected to the corresponding bump electrode 24 through a via hole which is formed by filling a metal material 27 into a through hole 25.

Through holes 26 are further formed at the carrier film 20, and the metal material 27 is filled into the through holes 26 so as to form via holes, each for connection between the wiring layer 22 and the electrode pad 31 as inner leads. Each via hole is adjustable in position, when formed, relative to the electrode pad 31 and the wiring layer 22. The inner-lead connection of the electrode pad 31 and the wiring layer 22 is achieved through this via hole.

The manufacturing method of the semiconductor device will be explained hereinbelow with reference to FIGS. 3(a) to 3(g).

Figure 3:
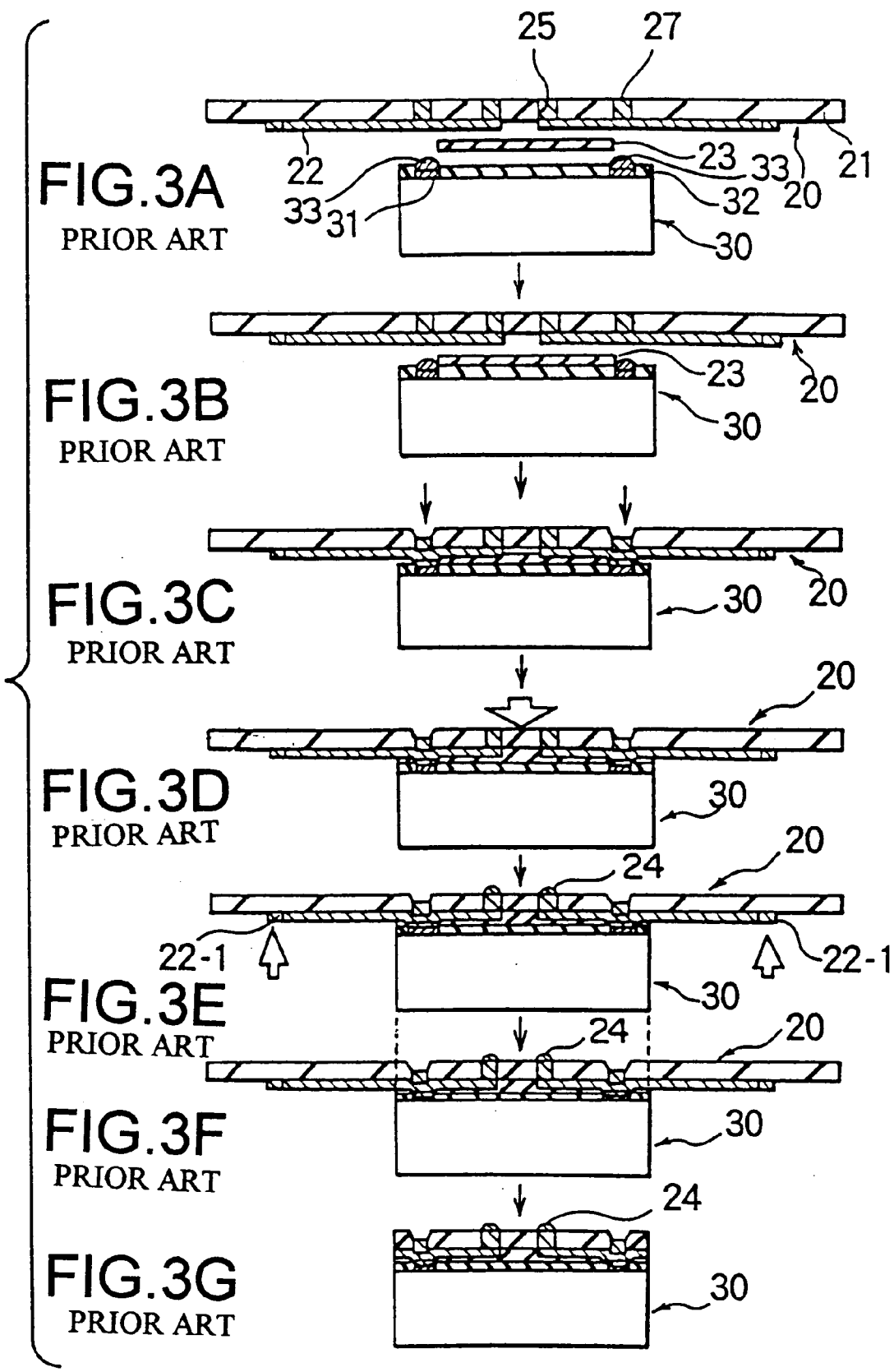
FIGS. 3(a) to 3(g) are diagrams showing fabricating processes of the semiconductor device shown in FIGS. 1 and 2.

As shown in FIG. 3(a), the carrier film 20, the adhesive film 23 and the semiconductor chip 30 are necessary for constituting the semiconductor device. Although it is not illustrated in FIG. 2, ball bumps 33 of gold are formed on the electrode pads 31.

Figure 4:
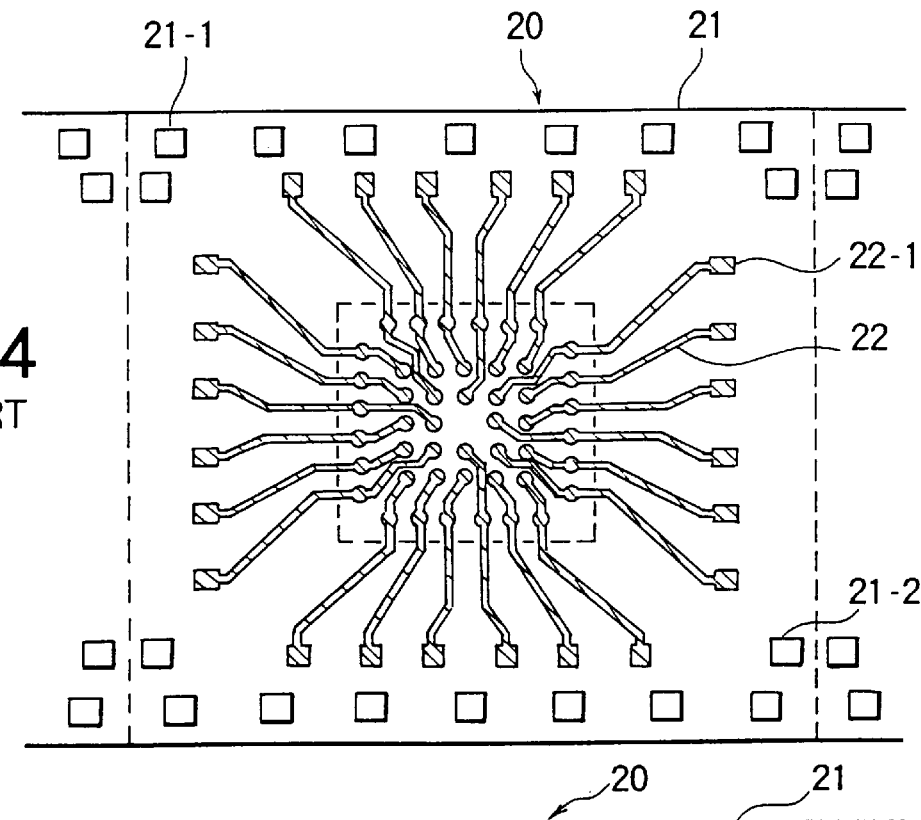
FIG. 4 is a plan view, seen from a side facing a semiconductor chip, of the carrier film shown in FIGS. 1 and 2.
Figure 5:
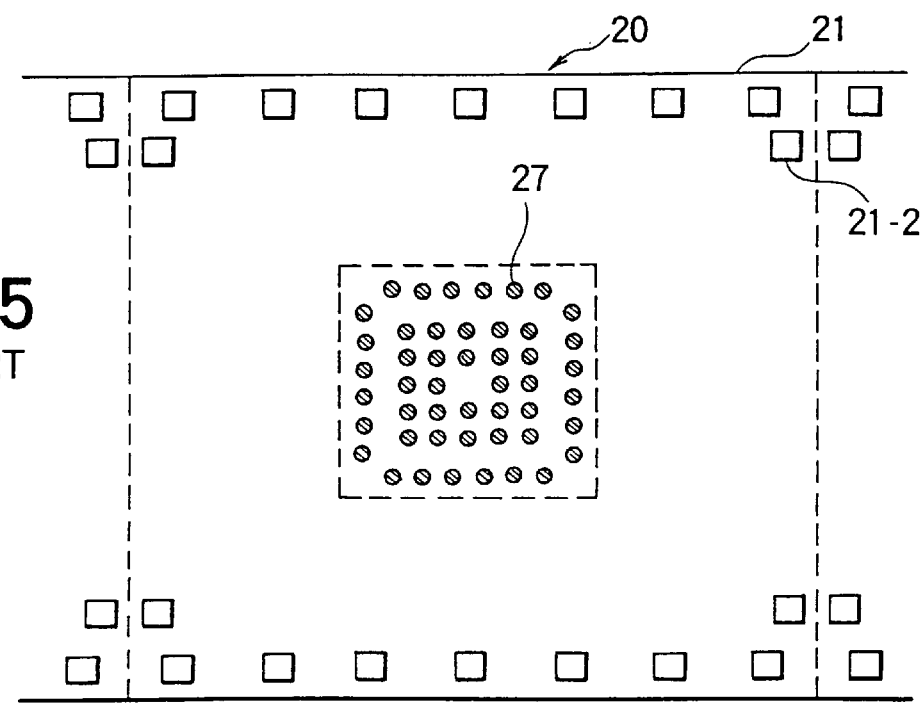
FIG. 5 is a plan view, seen from a side opposite to FIG. 4, of the carrier film shown in FIGS. 1 and 2.

The carrier film 20 is shown in FIGS. 4 and 5. FIG. 4 shows the carrier film 20 at a side of the wiring layers 22, that is, at a side facing the semiconductor chip 30. On the other hand, FIG. 5 shows an opposite side of the carrier film 20. The carrier film 20 is produced, for example, according to the following method:

First, a two-layer base member in the form of the polyimide organic insulating film 21 and the metal foil of copper or the like is prepared. The organic insulating film 21 has sprocket holes 21-1 formed beforehand in any appropriate manner such as punching. Using the photoresist method, the wiring layers 22 of desired shapes are formed on the two-layer base member so as to be properly positioned for connection to the electrode pads 31 of the semiconductor chip 30 through the ball bumps 33. As described before, each of the wiring layers 22 is connected to the metal material 27 at its one end. On the other hand, the other end thereof is connected to an electric-selection pad 22-1. Subsequently, the through holes 25 and 26 are formed at the organic insulating film 21 by etching, laser processing or the like.

Thereafter, the metal material 27 is filled into the through holes 25 and 26 by the electrolytic plating or the like for connection to the wiring layers 22. Finally, the organic insulating film 21 is etched so as to form positioning holes 21-2.

Referring to FIG. 3(b), the adhesive film 23 is set on the semiconductor chip 30. Subsequently, in FIG. 3(c), the single-point bonder, which is used for the TAB connection, is used so as to achieve the foregoing inner-lead connection after properly positioning between the carrier film 20 and the semiconductor chip 30 temporarily fixed with the adhesive film 23.

Subsequently, in FIG. 3(d), for bonding together the carrier film 20 and the semiconductor chip 30 with the adhesive film 23 sandwiched therebetween, heat and pressure are applied for several seconds from a side of the carrier film 20 or the semiconductor chip 30. At this time, bump electrodes 24 are formed on a side of the carrier film 20 facing an external board, in a grid at the same pitch.

Subsequently, in FIG. 3(e), the electric selection (BT) is performed in the same manner as in the normal tape carrier package (TCP), using the electric-selection pads 22-1.

Subsequently, in FIG. 3(f), after indicating an article name, using a laser beam, on a side of the semiconductor chip 30 remote from the carrier film 20, the die or laser is used to cut unnecessary portions of the semiconductor device. As a result, the chip-size package-type semiconductor device can be obtained as shown in FIG. 3(g).

As appreciated from the foregoing description, the chip-size package-type semiconductor device has been, in general, fabricated in the following manner:

After temporarily attaching the adhesive film 23 to either one of the semiconductor chip 30 and the carrier film 20, the electrode pads 31 and the wiring layers 22 are electrically connected to each other. Subsequently, the adhesive film 23 is bonded to the other of the semiconductor chip 30 and the carrier film 20 by applying heat and pressure. Accordingly, as shown in FIGS. 3(a) to (g), a size of the adhesive film 23 is limited to a size corresponding to an area defined within the electrode pads 31, that is, not corresponding to all the area of the joint surface of the semiconductor chip 30, so as to avoid overlapping the electrode pads 31.

However, in such a fabricating method, setting or positioning of the adhesive film 23 relative to the semiconductor chip 30 is difficult. Further, since the adhesive film 23 is not interposed between the semiconductor chip 30 and the carrier film 20 at regions along the edge of the semiconductor chip 30, sealing therebetween tends to be insufficient. When the sealing is insufficient, moisture proof is deteriorated, thus leading to insulation failure and further to reduction in life duration of the semiconductor device.

In order to solve such a problem, a thickness of the adhesive film 23 may be increased so as to expand the adhesive film 23 to the edge of the semiconductor chip 30 upon application of heat and pressure. However, this requires not only the adhesive material excessively, but also the pressing force excessively. This may be a cause of generating cracks in the semiconductor chip 30. Further, since the adhesive film 23 expands in a circular shape due to the applied pressure, it is rather difficult for the adhesive film 23 to reach corners of the semiconductor chip 30 which is rectangular. This causes the adhesive film 23 to be uneven in thickness after the pressurization thereof. In this case, the semiconductor chip 30 is bonded to the carrier film 20 in an inclined posture so that the semiconductor device is inclined when mounted onto the external board.

On the other hand, a gap exists between each electrode pad 31 and the corresponding wiring layer 22 due to a thickness of the adhesive film 23.. Thus, the connection between the electrode pads 31 and the wiring layers 22 is achieved by applying pressing forces to portions of the carrier film 20 corresponding to the electrode pads 31 using the bonding tool so as to deform such corresponding portions of the carrier film 20. However, due to a restoring force of the organic insulating film 21, it may be possible that, over a long period of time, the connection between the wiring layer 22 and the electrode pad 31 is spoiled or the wiring layer 22 is separated from the organic insulating film 21.

Figure 6:
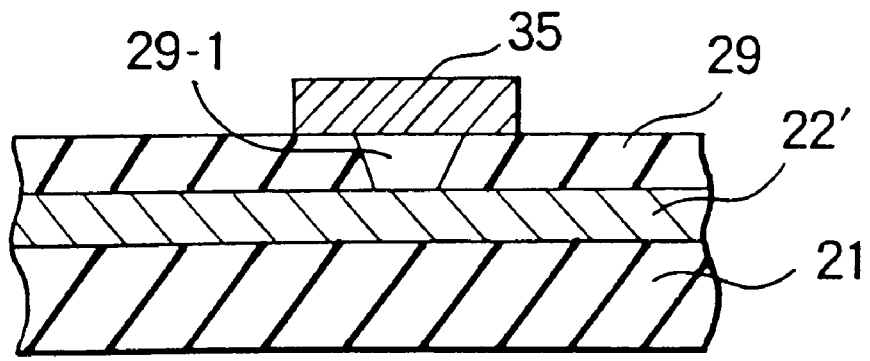
FIG. 6 is a sectional view for explaining a method of forming an electrode at a carrier film for connection to the exterior in a conventional semiconductor device.

On the other hand, in FIGS. 3(a) to 3(g), the carrier film 20 has the wiring layers 22 on its side confronting the semiconductor chip 30. However, it is possible that the wiring layers are formed on an opposite side of the carrier film 20. In this case, as shown in FIG. 6, wiring layers 22' are covered with a cover coating 29. For connecting each wiring layer 22' covered with the cover coating 29 to the wiring on the external board, an opening 29-1 is provided at the cover coating 29 for applying Au plating onto the exposed wiring layer 22' and providing bump electrodes by soldering. If a diameter of each opening 29-1 can be set large in light of designing or manufacturing, flux having high viscosity may be applied to each opening 29-1 in advance and a blanked soldering piece can be arranged at each opening 29-1.

However, in the chip-size package-type semiconductor device, a diameter of the opening 29-1 is very small so that a blanking diameter of the soldering piece should also be set very small. However, if the blanking diameter of the soldering piece is set so small, a sufficient supply amount of solder can not be obtained. Thus, in practice, as shown in FIG. 6, a soldering piece 35 having a diameter greater than that of the opening 29-1 is used so as to form it into a ball shape in the opening 29-1. In this case, it may be possible that the ball-shaped solder is out of contact with the wiring layer to cause contact failure and thus can not be used as an external terminal.

Further, in this kind of the chip-size package-type semiconductor device, it is important that a diameter of each of the through holes formed at the organic insulating film 21 be set as small as possible for rendering a pitch of the bump electrodes 24 shown in FIGS. 1 and 2 as small as possible. This will be explained with reference to FIG. 7. In general, the through hole 25 is formed by the chemical etching or the laser processing using the excimer (KrF) laser. The excimer laser is used because it is difficult to achieve the fine processing using the well-known YAG laser. However, it is also difficult to achieve the fine processing even using the chemical etching, and further, although the excimer laser can achieve the fine processing, its oscillating tube is expensive and its maintenance cost is high so that it is difficult to use the excimer laser.

Figure 7:
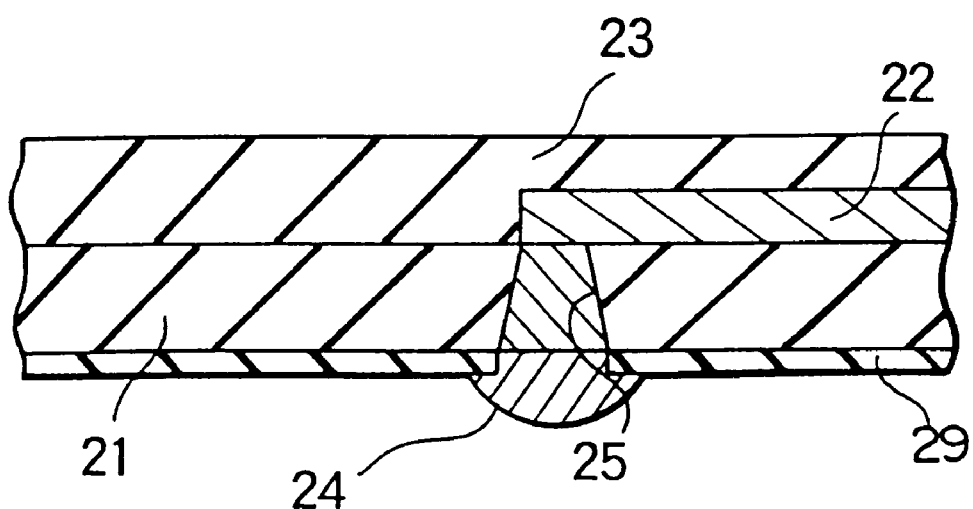
FIG. 7 is a sectional view for explaining a through hole formed at an organic insulating film and a structure of electrical connection achieved via the through hole in a conventional semiconductor device.

Under these circumstances, in the conventional processing method, a diameter of the through hole is 50 μm at minimum. Further, a shape of the through hole is tapered as shown in FIG. 7. Thus, narrowing of the pitches of the through holes is limited.

Embodiment

A chip-size package-type semiconductor device according to a first preferred embodiment of the present invention will be described hereinbelow with reference to FIGS. 8(a) to 8(e), FIGS. 9(a) to 9(e), and FIGS. 10(a) and 10(b).

Figure 8A:
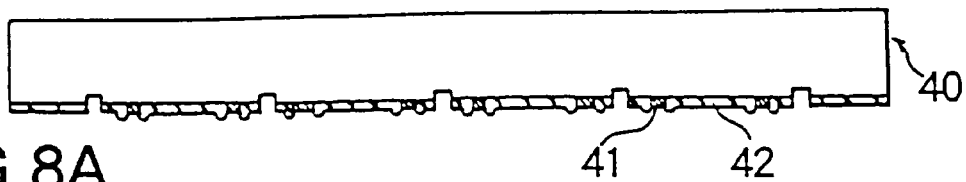
FIGS. 8(a) to 8(e) are diagrams showing the first half of fabricating processes of a semiconductor device according to a first preferred embodiment of the present invention.
Figure 8B:
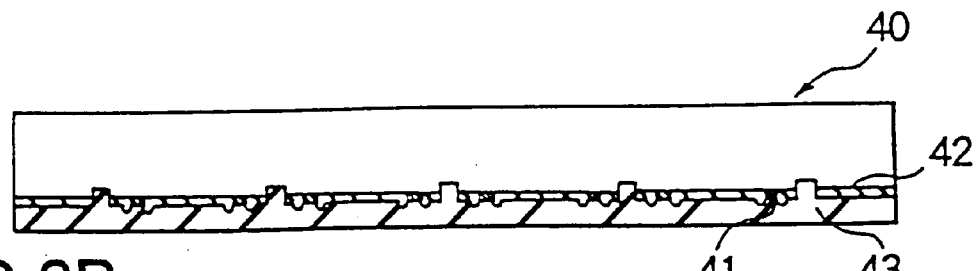

In FIG. 8(a), a semiconductor wafer 40 is provided. The semiconductor wafer 40 is formed with a number of IC's (integrated circuits) and includes a plurality of electrode pads 41 on one side of each of the IC's for connection to the exterior. The IC's are in the form before being diced out from the semiconductor wafer 40 as semiconductor chips. A region on the foregoing one side of each IC other than at the electrode pads 41 is covered with a passivation film 42 as in the prior art. In FIG. 8(b), an adhesive layer 43 is formed over all the area of one side of the semiconductor wafer 40 where the electrode pads 41 are formed. As a material of the adhesive layer 43, photosensitive resin, such as polyimide or epoxy, is used. The adhesive layer 43 is about several micrometers to ten and several micrometers in thickness and formed by the spin coating method. The adhesive layer 43 may also be formed by, for example, sticking a film of adhesive on the foregoing side of the semiconductor wafer 40.

Figure 8C:
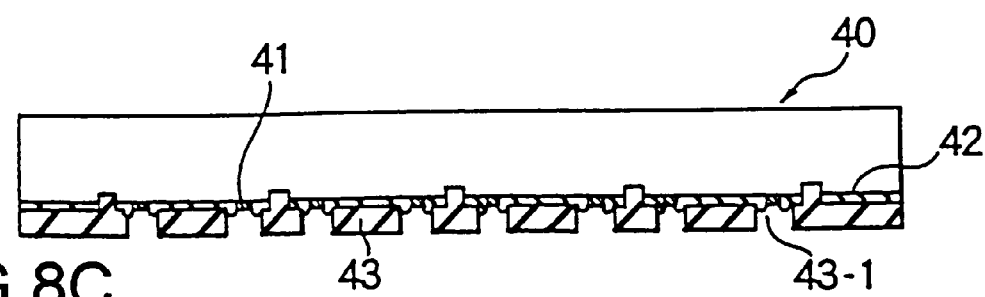
Figure 10A:
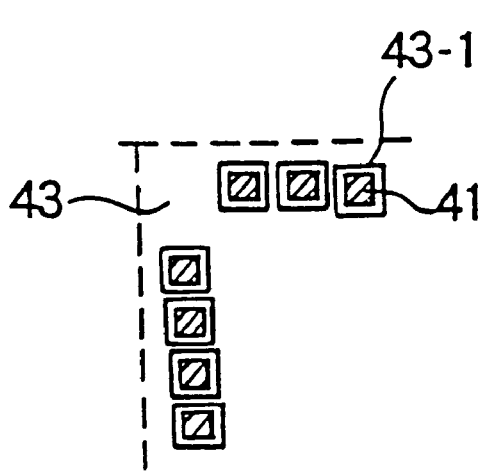
FIGS. 10(a) and 10(b) are diagrams showing examples of openings formed at an adhesive layer according to the first preferred embodiment.
Figure 10B:
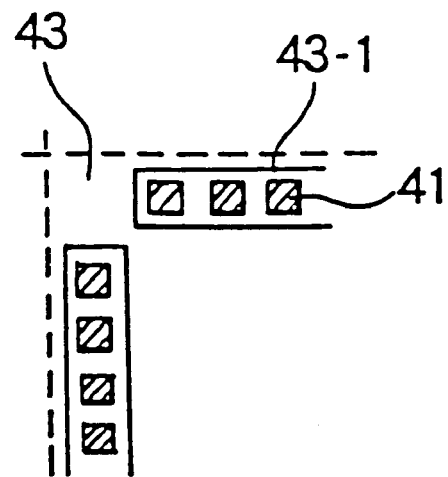

In FIG. 8(c), for exposing each electrode pad 41 to the outside, an opening 43-1 is formed through the adhesive layer 43 at a position corresponding to the electrode pad 41. The openings 43-1 are formed by the chemical etching, but may also be formed by the laser processing. As shown in FIG. 10(a), the opening 43-1 is provided per electrode pad 41. Alternatively, as shown in FIG. 10(b), each opening 43-1 may be formed into an elongate shape for accommodating a plurality of the electrode pads 41. In the former case (FIG. 10(a) ), the openings 43-1 are arranged at regular pitches of about 50 μm, each having a width of about several ten micrometers to 100 μm. In the latter case (FIG. 10(b) ), each opening 43-1 has a width of about 150 μm.

Figure 8D:
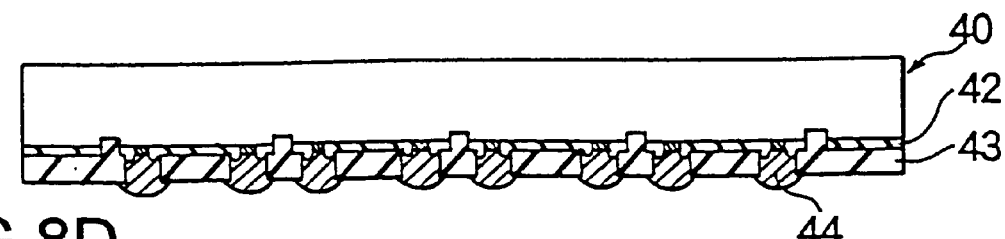

In FIG. 8(d), electrodes 44 are formed at the openings 43-1, respectively. Each electrode 44 is in the form of a metal projection or a metal ball bump. In case of the metal projection, the electrode 44 is formed by plating. In this case, it is known to form an electrode by coating a projection of copper (Cu) with gold (Au). On the other hand, in case of the ball bump, while the same materials may be used, it is preferable to use a material which is a mixture of gold (Au) with palladium (Pd) added thereto. The mixture of gold and palladium is suitable for reducing a diameter of the ball bump, and further achieves an effect of enhancing a joint strength relative to later-described wiring layers on a carrier film as compared with the foregoing materials forming the metal projection.

As described later, the process of FIG. 8(d), that is, the process of providing the electrodes 44, may be omitted depending on a structure of the carrier film.

Figure 8E:
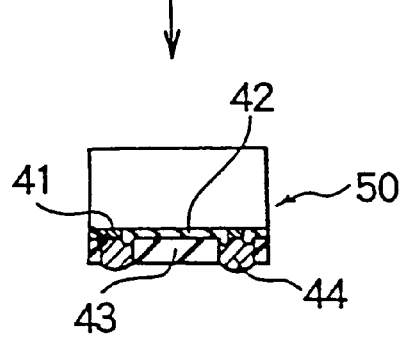

In FIG. 8(e), the IC's are diced out one by one from the semiconductor wafer 40 as a semiconductor chip 50. When the electrodes 44 are formed by the ball bumps, the processes in FIGS. 8(d) and 8(e) may be reversed in order.

Figure 9A:
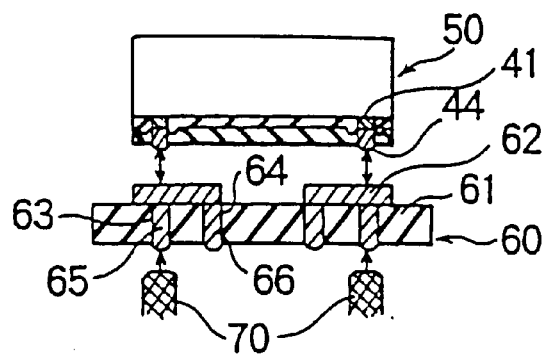
FIGS. 9(a) to 9(e) are diagrams showing the latter half of the fabricating processes of the semiconductor device according to the first preferred embodiment.

In FIG. 9(a), a carrier film 60 is provided. The carrier film 60 includes an organic insulating film 61 and wiring layers 62 formed on one of main surfaces or sides of the organic insulating film 61 confronting the semiconductor chip 50. A carrier film having wiring layers on a side remote from the semiconductor chip 50 will be described later. The organic insulating film 61 is formed with through holes 63 at portions corresponding to the electrode pads 41, that is, the electrodes 44, and further formed with through holes 64 at portions for connection to an external board (not shown). These through holes 63 and 64 are formed by the Ar laser processing and the washing processing. The ultrasonic processing may be the most proper as the washing processing. A metal material 65 is filled into each through hole 63 by plating, and a metal material 66 is filled into each through hole 64 by plating. The metal material 65 filled into the through hole 63 is used as a medium for receiving a bonding tool 70 upon connection between the electrode 44 and the wiring layer 62. The metal material 65 may be omitted. On the other hand, the metal material 66 filled into the through hole 64 works as an electrode for connection to the external board, and thus is formed as slightly projecting from the through hole 64. The material forming the electrode 44 is used for the metal materials 65 and 66.

In the process of in FIG. 9(a), the connection between the wiring layers 62 of the carrier film 60 and the electrodes 44 of the semiconductor chip 50 is performed. As is known, this connection is achieved by applying the bonding tool 70 to the metal material 65 so as to firmly attach the wiring layer 62 to the corresponding electrode 44 under pressure.

Figure 9B:
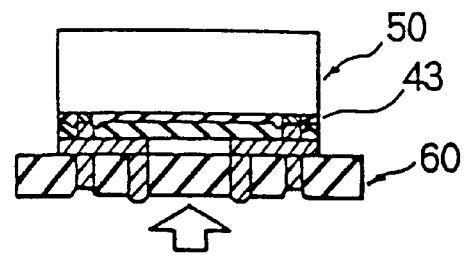

In the process in FIG. 9(b), the carrier film 60 is pressed upon the semiconductor chip 50 while heating the adhesive layer 43 so that the semiconductor chip 50 and the carrier film 60 are bonded together via the adhesive layer 43.

Figure 9C:
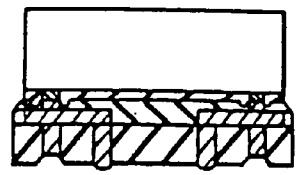
Figure 9D:
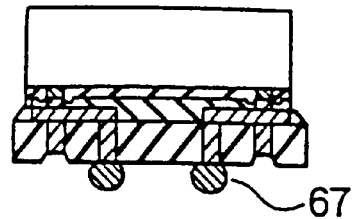

In the process in FIG. 9(c), the carrier film 60 is cut approximately along the edge of the semiconductor chip 50 so as to provide the semiconductor device of a chip size. Thereafter, as shown in FIG. 9(d), a ball bump electrode 67 is formed at the tip of each metal material 66 to work as an electrode for connection to the external board. As a material of the ball bump electrode 67, solder is mainly used. On the other hand, Au or Au added with Pd may also be used therefor.

Figure 9E:
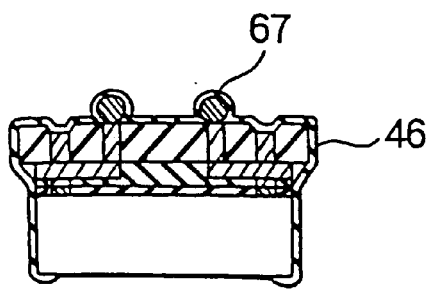

Subsequently, in the process of in FIG. 9(e), the outer surfaces of the chip-size semiconductor device are coated with a coating film 46 formed of a fluororesin coating material using the spin coating method. The coating film 46 is provided for preventing the insulation failure due to an invasion of water into the semiconductor device via the joint portion between the semiconductor chip 50 and the carrier film 60 and for preventing an invasion of water into the semiconductor device through the organic insulating film 61. As appreciated in FIG. 9(e), the spin coating is performed onto the semiconductor device with the ball bump electrodes 67 being located at the top. Accordingly, the coating film 46 is formed substantially all over the outer surfaces of the semiconductor device except at the upper surface of the semiconductor chip 50. On the other hand, since the region around the joint portion between the semiconductor chip 50 and the carrier film 60 most requires the reliable sealing, it may be possible to form the coating film only at the region around the joint portion at a lateral side of the semiconductor device.

In the spin coating method, the coating film also covers the ball bump electrodes 67. Thus, connection failure is expected when connecting the ball bump electrodes 67 to the external board. However, in practice, since the fluororesin is poor in wettability relative to metal, a thickness of the coating film formed on each ball bump electrode 67 is small. Further, since heat and pressure are applied to each ball bump electrode 67 upon connection to the external board, the coating film on the ball bump electrode 67 tends to be broken and thus raises no problem from a practical point of view. In addition, each ball bump electrode 67 has a spherical shape so that it is difficult for the fluororesin to adhere to the ball bump electrode 67 also from this point of view. This becomes more significant by increasing a height of the ball bump electrode 67. The coating film 46 may be formed by dipping the semiconductor device into the fluororesin coating material, instead of using the foregoing spin coating method.

According to the foregoing first preferred embodiment, the following effects can be achieved:

By forming the adhesive layer 43 on the semiconductor wafer 40 before cutting the semiconductor chips therefrom, the accurate positioning of the adhesive film relative to the semiconductor chip is not required as opposed to the prior art. Further, the adhesive layer 43 can be provided in a uniform thickness all over the joint surface between the semiconductor chip 50 and the carrier film 60. As a result, the inclination of the semiconductor chip 50 on the carrier film 60 can be prevented, and the sealing at the joint portion between the semiconductor chip 50 and the carrier film 60 can be reliably achieved. Further, the region around the joint portion between the semiconductor chip 50 and the carrier film 60 at the lateral side of the semiconductor device is coated with the coating film 46 so that the sealing is ensured further reliably.

Further, in the process in FIG. 8(d), each electrode 44 is formed so as to slightly project from the corresponding opening 43-1 of the adhesive layer 43. As a result, a gap is not caused relative to the corresponding wiring layer 62, which would be otherwise caused due to a step corresponding to a thickness of the adhesive layer 43 as in the prior art. This means that the connection between the electrode 44 and the wiring layer 62 is achieved without deformation of the organic insulating film 61. Thus, the connection between the electrode 44 and the wiring layer 62 is not spoiled, and the wiring layer 62 is not separated from the organic insulating film 61, which would be otherwise caused due to deformation of the organic insulating film 61.

Further, in the process in FIG. 9(a), since the connection between the electrodes 44 and the wiring layers 62 is performed before applying heat and pressure to the adhesive layer 43, the openings 43-1 are prevented from being closed due to the application of heat and pressure to the adhesive layer 43 so that the connection between the electrodes 44 and the wiring layers 62 is reliably achieved.

Moreover, the through holes 63 and 64 of the carrier film 60 are formed by the Ar laser processing and the washing processing. The Ar laser processing is lower in running cost as compared with the excimer laser processing and is capable of rendering a shape of each through hole non-tapered, that is, rendering a circumferential wall of each through hole vertical. Further, a diameter of the through hole can be rendered less than 50 μm. Thus, further narrowing of the pitches of the through holes 63 and 64 can be realized. As appreciated, in the inner-lead connection, narrowing of the pitches of the through holes 63 is important. The openings 43-1 of the adhesive layer 43 may also be formed by the Ar laser processing.

Figure 11:
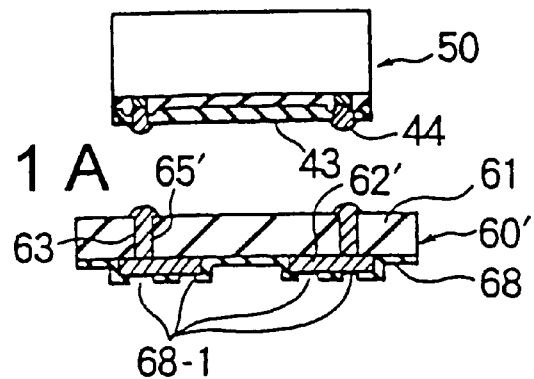
FIGS. 11(a) to 11(e) are diagrams, corresponding to FIGS. 9(a) to 9(e), showing the latter half of fabricating processes of a semiconductor device according to a modification of the first preferred embodiment.

FIGS. 11(a) to 11(e) show a modification of the first preferred embodiment. In the modification, the carrier film differs from that in the first preferred embodiment. Specifically, as shown in FIG. 11(a), although the semiconductor chip 50 is the same as that in the first preferred embodiment, a carrier film 60' includes wiring layers 62' formed on the main side of the organic insulating film 61 opposite to the main side thereof confronting the semiconductor chip 50. In this case, the organic insulating film 61 is formed with the through holes, that is, the through holes 63, only at portions corresponding to the electrodes 44. The through holes 63 are formed by the Ar laser processing and the washing processing as in the first preferred embodiment. Into the through holes 63, a metal material 65', which is the same as the metal material 65, is filled by plating as in FIG. 9(a). The metal material 65' is filled into each through hole 63 so as to slightly project from the main surface of the organic insulating film 61. The wiring layers 62' are coated with a cover coating 68 formed of an insulating material. The cover coating 68 is formed with openings 68-1 at portions corresponding to the metal material 65' and at portions for connection to the external board.

Figure 11B:
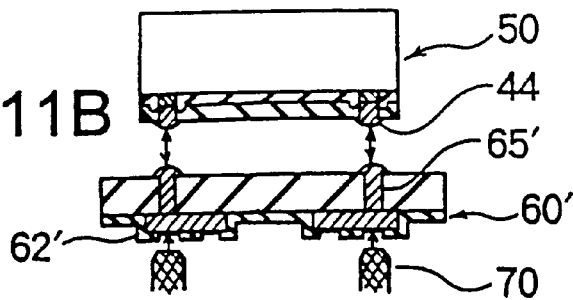

In the process in FIG. 11(b), the connection between the metal material 65' of the carrier film 60' and each of the electrodes 44 of the semiconductor chip 50 is performed. This connection is achieved by applying the bonding tool 70 to the wiring layer 62' via the opening 68-1 corresponding to the metal material 65' so as to firmly attach the metal material 65' to the corresponding electrode 44 under pressure.

Figure 11C:
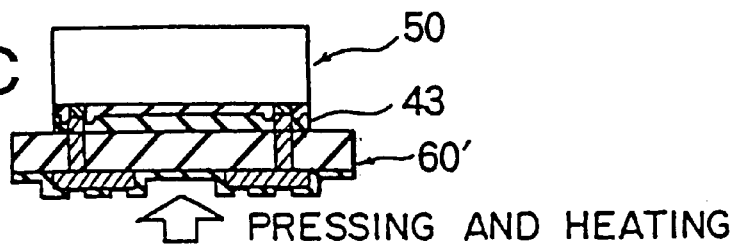

In the process in FIG. 11(c), the carrier film 60' is pressed upon the semiconductor chip 50 while heating the adhesive layer 43 so that the semiconductor chip 50 and the carrier film 60' are bonded together via the adhesive layer 43.

Figure 11D:
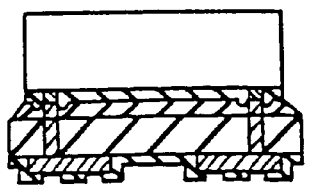
Figure 11E:
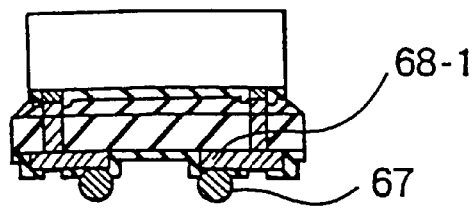

In the process in FIG. 11(d), the carrier film 60' is cut approximately along the edge of the semiconductor chip 50 so as to provide the semiconductor device of a chip size. Thereafter, as shown in FIG. 11(e), the ball bump electrode 67 is formed at the opening 68-1 to work as an electrode for connection to the external board. As a material of the ball bump electrode 67, solder is mainly used. On the other hand, Au or Au added with Pd may also be used therefor.

Subsequently, as described with reference to FIG. 9(e), the outer surfaces of the chip-size semiconductor device are coated with the coating film formed of a fluororesin coating material using the spin coating method.

Figure 12A:
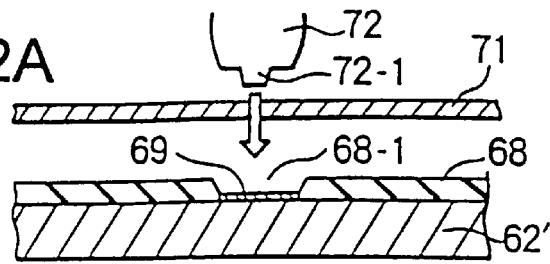
FIGS. 12(a) to 12(c) are diagrams showing formation processes of a ball bump electrode according to the modification of the first preferred embodiment.
Figure 12B:
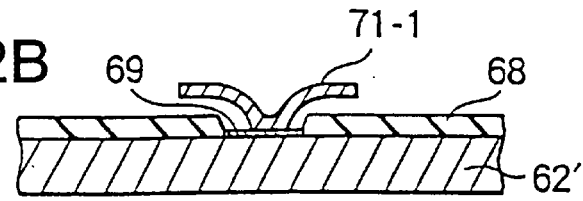
Figure 12C:
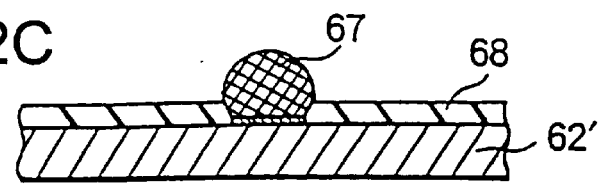

Now, a method of forming the bump electrode 67 as described with reference to FIG. 11(e) will be described with reference to FIGS. 12(a) to 12(c). In FIG. 12(a), an electrode pad 69 is formed by Au plating on the wiring layer 62' exposed at the opening 68-1 for connection to the external board. On this electrode pad 69 is formed the bump electrode 67. For forming the bump electrode 67, a commercial solder ribbon 71 in the form of a plate and a commercial special punching jig 72 are used. The special punching jig 72 has the same function as a normal punch, but differs from the normal punch in that a small projection 72-1 is formed at its tip. A portion of the solder ribbon 71 is punched out using the special punching jig 72 so that a solder piece 71-1 punched out from the solder ribbon 71 projects downward at its center so as to have an essentially T-shape in section. As shown in FIG. 12(b), a pressing force is applied to the T-shaped solder piece 71-1 so as to temporarily joint the center of the solder piece 71-1 to the electrode pad 69. Thereafter, the solder piece 71-1 is applied with flux and heated so that, as shown in FIG. 12(c), the solder piece 71-1 is formed into a ball shape so as to be the bump electrode 67.

According to the foregoing method, the following effects can be achieved in addition to the effects achieved in the first preferred embodiment:

Specifically, since a sufficient amount of solder is ensured for forming the bump electrode 67 and a portion of the solder piece 71-1 is temporarily jointed to the electrode pad 69, even when a diameter of the opening 68-1 is small, the connection between the bump electrode 67 and the electrode pad 69 can be reliably achieved. As appreciated, the processes shown in FIGS. 11(a) to 11(e) and 12(a) to 12(C) are executed following the process in FIG. 8(e).

Figure 13A:
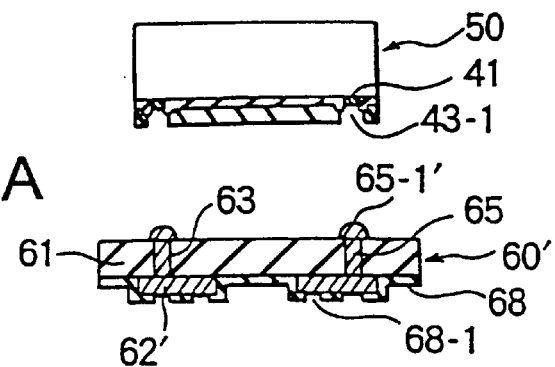
FIGS. 13(a) and 13(b) are diagrams for explaining another modification of the first preferred embodiment.
Figure 13B:
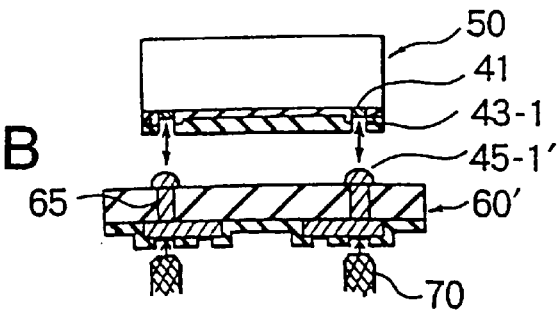

FIGS. 13(a) and 13(b) show another modification of the first preferred embodiment. As in the modification of FIGS. 11(a) to 11(e), the carrier film 60' is formed with the wiring layers 62' on the surface of the organic insulating film 61 opposite to the surface thereof confronting the semiconductor chip 50. This modification is applied to the case wherein the electrodes 44 are not formed at the openings 43-1 of the adhesive layer 43 in the process in FIG. 8(d) in the first preferred embodiment. As in FIGS. 11(a) to 11(e), the metal material 65' is filled into each of the through holes 63 of the carrier film 60'. On the other hand, in this modification, as shown in FIG. 13(a), a bump electrode 65-1' is further formed at the tip of the metal material 65'. As appreciated, a height of the bump electrode 65-1' is set no less than a thickness of the adhesive layer 43.

In FIG. 13(b), after the connection between the electrode pad 41 and the bump electrode 65-1' is performed using the bonding tool 70 in the same manner as in FIG. 11(b), the bonding process is performed in the same manner as in FIG. 11(c). The processes in FIGS. 13(a) and 13(b) are performed between the process in FIG. 8(e) and the process in FIG. 11(c). Accordingly, this modification achieves effects which are substantially the same as those achieved in the modification of FIGS. 11(a) to 11(e) and 12(a) to 12(c).

Figure 14:
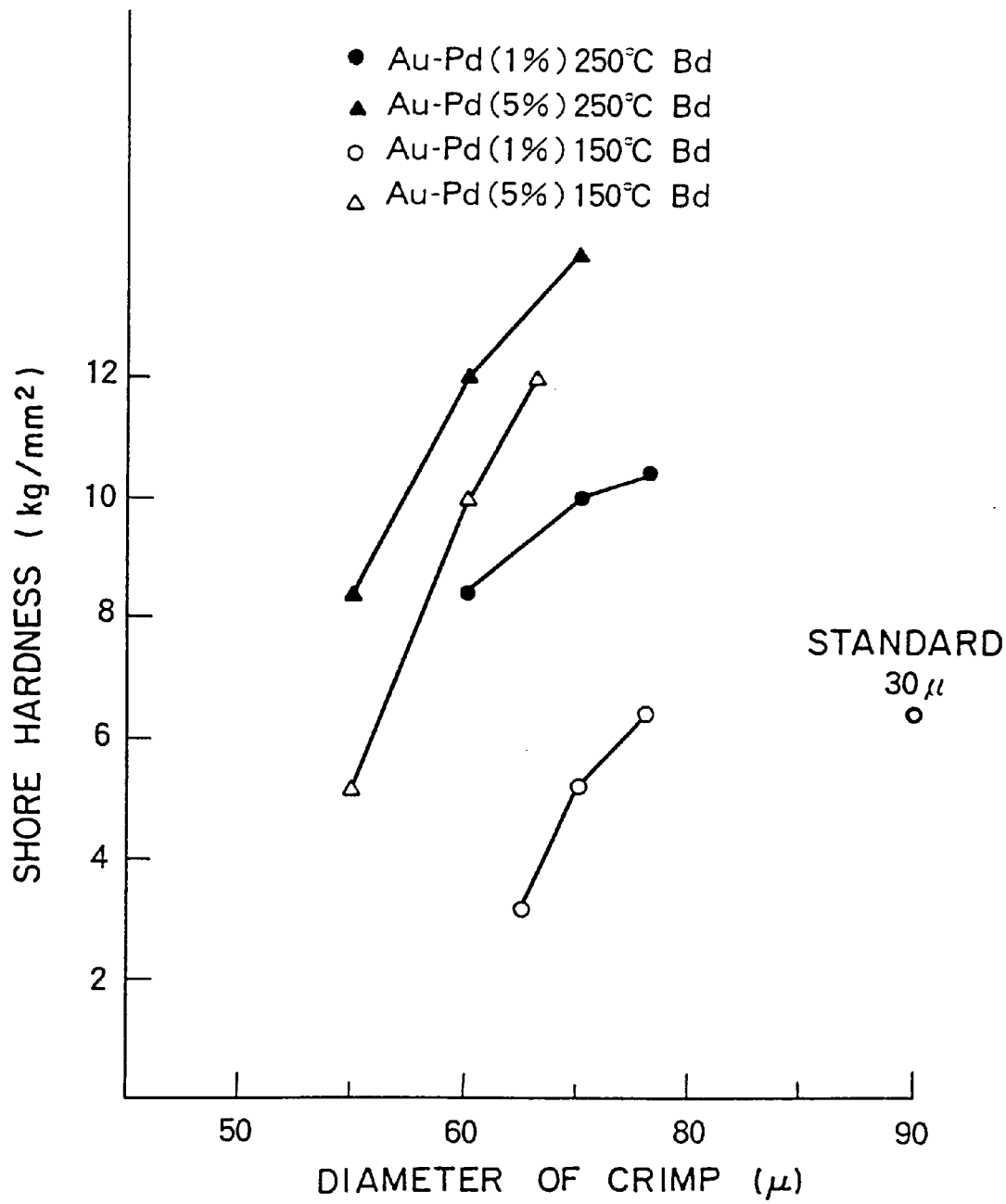
FIG. 14 is a diagram showing a relationship between a diameter of a material (Au added with Pd) when pressed to another member and a shear strength thereof, wherein the material is used for forming an electrode in the first preferred embodiment.

FIG. 14 shows a relationship between a diameter of a material (Au added with Pd) when pressed to another member and a shear strength thereof, wherein the material is used for, for example, the bump electrode or the ball bump electrode. As appreciated from FIG. 14, the strength becomes greater as an added amount of Pd increases and as a heating temperature increases.

Now, a second preferred embodiment of the present invention will be described with reference to FIGS. 15(a) to 15(h). In the second preferred embodiment, the adhesive layer 43 described in the first preferred embodiment is formed on the carrier film, and the diced-out semiconductor chip is used. Further, in the second preferred embodiment, the carrier film includes the wiring layers on the surface of the organic insulating film confronting the semiconductor chip, as described with reference to FIG. 9(a).

Figure 15A:
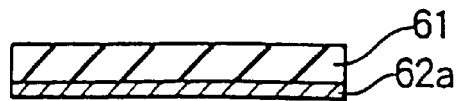
FIGS. 15(a) to 15(h) are diagrams showing fabricating processes of a semiconductor device according to a second preferred embodiment of the present invention.
Figure 15B:
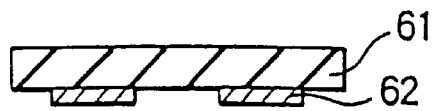
Figure 15C:
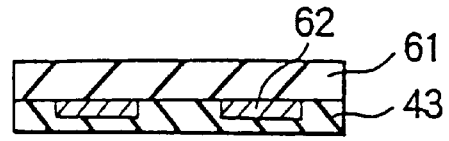

In FIG. 15(a), a two-layer base member in the form of the organic insulating film 61 (for example, 25 μm in thickness) and a copper foil 62a (for example, 18 μm in thickness) stacked on one of main surfaces or sides of the organic insulating film 61 is provided. In FIG. 15(b), the pattern etching is performed on the copper foil 62a so as to form the wiring layers 62. In FIG. 15(c), the adhesive layer 43 is formed on a side of the organic insulating film 61 where the wiring layers 62 are formed. The adhesive layer 43 is formed by the spin coating method or by sticking the adhesive film as in the foregoing first preferred embodiment.

Figure 15D:
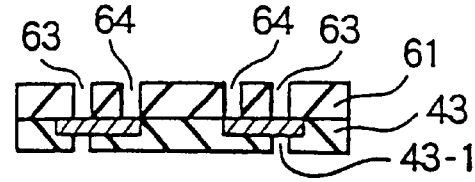

In FIG. 15(d), the organic insulating film 61 is formed with the through holes 63 and 64, and the adhesive layer 43 is formed with the openings 43-1. As described in the first preferred embodiment, it is preferable that the through holes 63 and 64 are formed by the Ar laser processing and the washing processing. On the other hand, the chemical etching may be used for forming the through holes 63 and 64. The openings 43-1 may also be formed by the Ar laser processing or the chemical etching.

Figure 15E:
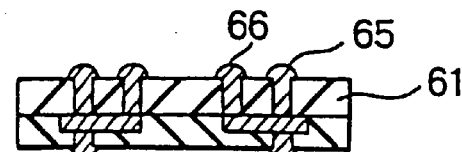

In FIG. 15(e), the metal material 65 is filled into the through holes 63 by plating, and the metal material 66 is filled into the through holes 64 by plating. A metal material 75 is also filled into the openings 43-1 by plating. As described with reference to FIG. 9(a), the filling of the metal material 65 into the through holes 63 may be omitted. Further, the filling of the metal material by plating may be performed only for the through holes of the organic insulating film 61. In this case, the openings 43-1 of the adhesive layer 43 are provided with ball-shaped bump electrodes each formed of Au or Au added with Pd. As appreciated, these bump electrodes may be provided at the semiconductor chip 50 rather than at the openings 43-1.

Figure 15F:
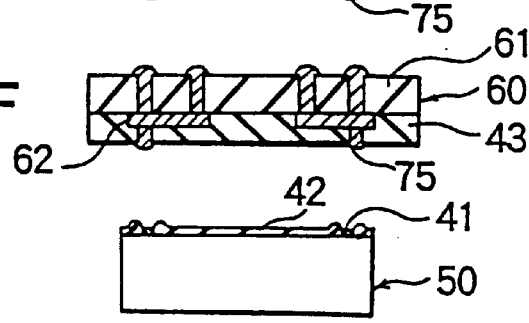

In FIG. 15(f), the diced-out semiconductor chip 50 is provided. In the process in FIG. 15(g), the metal material 75 is connected to each of the electrode pads 41. As described with reference to FIG. 9(a), this connection is achieved by applying the bonding tool 70 to the metal material 65 so as to firmly attach the metal material 75 to the corresponding electrode pad 41 under pressure. Thereafter, as described with reference to FIG. 9(b), by applying heat and pressure, the semiconductor chip 50 and the carrier film 60 are bonded together via the adhesive layer 43 interposed therebetween.

Subsequently, in FIG. 15(h), as described with reference to FIG. 9(d), the bump electrode 67 is provided at the tip of the metal material 66, and the carrier film 60 is cut into a chip size so that the semiconductor device is obtained. Thereafter, as described with reference to FIG. 9(e), the outer surfaces of the semiconductor device, particularly the lateral side thereof, are coated with the coating film formed of the fluororesin coating material.

FIGS. 16(a) to 16(g) show a modification of the second preferred embodiment. In this modification, the organic insulating film 61 is used so as to locate the wiring layers formed thereon at the side remote from the semiconductor chip. Accordingly, in FIG. 16(a), the adhesive layer 43 is formed on the main surface opposite to the main surface where the wiring layers 62' are formed. The adhesive layer 43 is formed in the same manner as in the first preferred embodiment. On the other hand, when adhesion between the adhesive layer 43 and the organic insulating film 61 is insufficient, the plasma ashing or the UV (ultraviolet) irradiation may be applied to the surface of the organic insulating film 61 where the adhesive layer 43 is to be formed, so as to improve the adhesion therebetween.

In FIG. 16(b), for connection between each wiring layer 62' and the corresponding electrode pad of the semiconductor chip, the opening 43-1 and the through hole 63 are formed by the Ar laser processing so as to penetrate the adhesive layer 43 and the organic insulating film 61, respectively. In FIG. 16(c), the through hole 63 and the opening 43-1 are filled with a metal material 76 by plating. The tip of the metal material 76 is arranged to project sufficiently from the adhesive layer 43. On the other hand, in FIG. 16(d), the main surface of the organic insulating film 61 at a side of the wiring layers 62' is coated with the cover coating 68. The openings 68-1 are formed by the Ar laser processing at portions corresponding to the metal material 76 and at portions for connection to the external board.

Thereafter, in FIG. 16(e), the semiconductor chip 50 is provided. In FIG. 16(f), the connection between the metal material 76 and each of the electrode pads 41 of the semiconductor chip 50 is achieved in the same manner as in FIG. 13(b). Subsequently, the semiconductor chip 50 and the carrier film 60' are bonded together via the adhesive layer 43 interposed therebetween. Further, the carrier film 60' is cut into a chip size, and as shown in FIG. 16(g), the ball bump electrodes 67 are provided at the openings 68-1 of the cover coating 68 for connection to the external board. As appreciated, thereafter, the outer surfaces of the semiconductor device, particularly the lateral side thereof, are coated with the coating film formed of the fluororesin coating material. The processes in FIGS. 16(a) to 16(g) are executed following the process in FIG. 15(b).

In the second preferred embodiment, the adhesive layer 43 is formed on the carrier film and bonded to the dice-out semiconductor chip 50. Alternatively, the adhesive layer may be formed on a surface of the diced-out semiconductor chip 50 where the electrode pads 41 are formed, so as to cover all the area thereof. Specifically, after forming the adhesive layer on the diced-out semiconductor chip 50, the openings are formed by the laser processing or the chemical etching at portions of the adhesive layer corresponding to the electrode pads 41. Thereafter, by filling the metal material into these openings by plating or by providing the ball bump electrodes at the openings, the semiconductor chip 50 having the adhesive layer 43 as shown in FIG. 8(e) can be produced.

Either of the second preferred embodiment and the modification thereof can achieve effects similar to those achieved in the first preferred embodiment.

FIGS. 17(a) and 17(b) show another modification of the second preferred embodiment. In this modification, as in the second preferred embodiment, the carrier film 60 is formed with the wiring layers 62 at the side confronting the semiconductor chip 50. On the other hand, as shown in FIG. 17(a), the filling of the metal material into the openings 43-1 of the adhesive layer 43 by plating is not performed as opposed to the process in FIG. 15(e). Thus, the semiconductor chip 50 is provided with the bump electrodes 47 on the electrode pads 41.

Figure 15G:
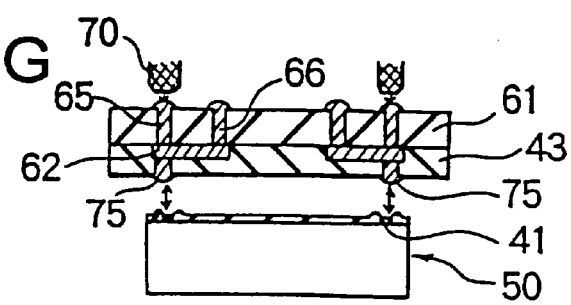
Figure 15H:
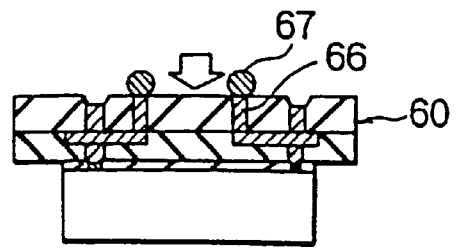

In FIG. 17(b), after the connection between the wiring layers 62 and the bump electrodes 47 is achieved using the bonding tool 70 in the same manner as in FIG. 15(g), the semiconductor chip 50 and the carrier film 60 are bonded together via the adhesive layer 43 interposed therebetween. The processes in FIGS. 17(a) and 17(b) are executed instead of the processes in FIGS. 15(e) to 15(g). Accordingly, this modification achieves effects similar to those achieved in the second preferred embodiment.

Figure 18:
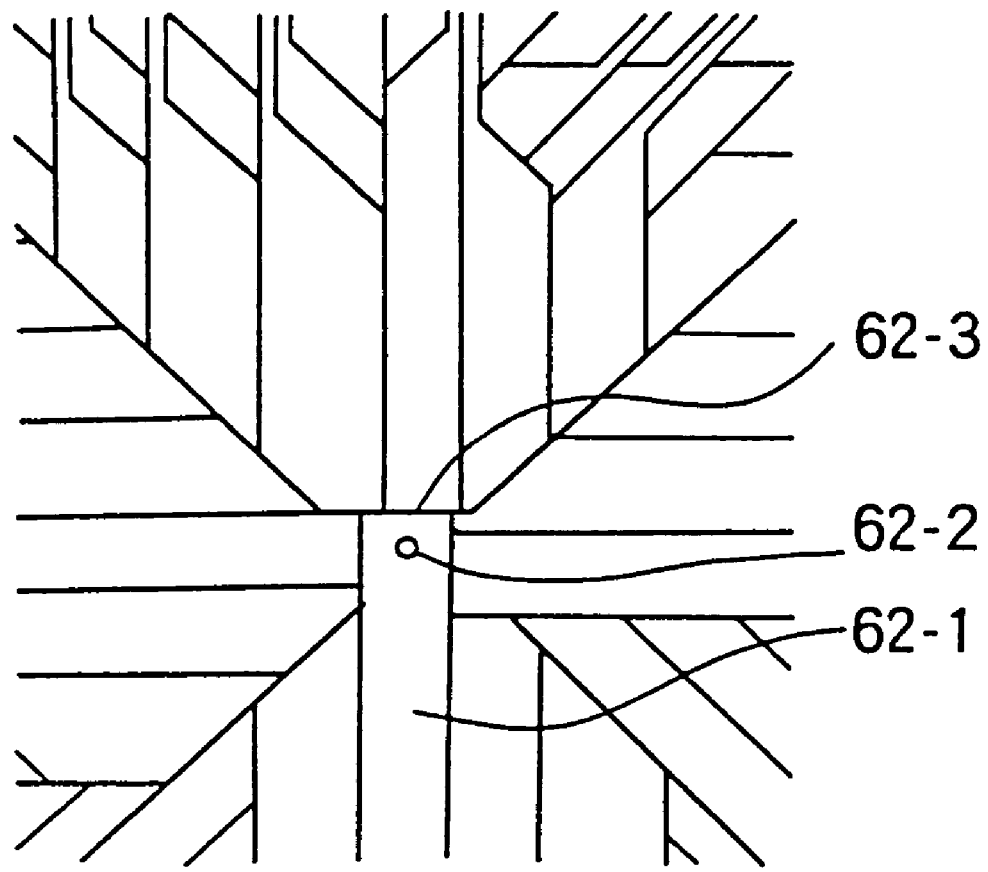
FIG. 18 is a diagram showing an example of a mark provided on a carrier film for directional matching of the semiconductor device of the preferred embodiments of the present invention.

FIG. 18 is a diagram for explaining an example, wherein the directional matching is easily achieved upon mounting the semiconductor device onto the external board. In this example, a mark for achieving the directional matching is formed by using a portion of the wiring layers 62 of the carrier film. In general, the wiring layers of the carrier film are formed by etching the copper foil of the two-layer base member (see FIG. 15(a)) so that the etching regions are limited as small as possible. This is appreciated from FIG. 18, wherein the etching regions are represented by solid lines which are very small. As a result, the wiring layers tend to remain largely at the center of the carrier film. In FIG. 18, an opening 62-2 is formed at a copper foil which remains as a wiring layer 62-1 at the center of the carrier film during the etching process. A user memorizes the opening 62-2 and configuration of the wiring layers around the opening 62-2 in advance. As a result, when mounting the semiconductor device onto the external board, the user can easily judge which side of the rectangular semiconductor device should be an upper side. For example, in FIG. 18, the directional matching is achieved by setting an edge 62-3 of the wiring layer 62-1 formed with the opening 62-2 to be an upper side.

If a shape of the opening 62-2 is not circular, but is capable of identifying a particular direction, such as an isosceles triangle, the directional matching can be achieved more easily. Further, if no wiring layers remain at the center of the carrier film, the opening may be formed at the organic insulating film 61. In any case, the foregoing directional matching mark in the form of the opening may apply to any of the foregoing preferred embodiments.

While the present invention has been described in terms of the preferred embodiments, the present invention can be embodied in various other ways. For example, the processing of the through holes 63 and 64 is not limited to the Ar laser processing, but may be the excimer laser processing or the carbon dioxide laser processing. On the other hand, the openings 43-1 of the adhesive layer 43 may be formed by the Ar laser processing. Further, in any of the foregoing preferred embodiments, the formation of the fluororesin coating film on the outer surfaces of the semiconductor device may be omitted.

As described above, the following effects can be achieved according to the foregoing preferred embodiments:

A. The semiconductor chip and the carrier film are bonded together via the adhesive layer extending all over the joint surface therebetween. Accordingly, the adhesive layer can be interposed uniformly between the semiconductor chip and the carrier film, and thus the sealing around the joint portion therebetween can be reliably achieved. Since the openings required at the adhesive layer for the electrical connection can be formed by the fine processing, such as the laser processing or the chemical etching, these openings can be formed with high positional accuracy.

B. At least the lateral side of the semiconductor device, that is, the region around the joint portion between the semiconductor chip and the carrier film, is coated with the coating film. Accordingly, deterioration of the joint portion due to the heating process and the washing process required for mounting onto the external board can be prevented so that the moisture proof is further improved.

C. The steps or gaps caused by forming the openings at the adhesive layer are eliminated by filling the metal material into the openings or by providing the ball bump electrodes at the openings. By using Au added with Pd as a material of the ball bump electrode, the joint strength can be enhanced so that a diameter of the ball bump electrode can be reduced to achieve narrowing of the pitches of the ball bump electrodes.

D. In case the carrier film has the wiring layers on the surface thereof opposite to its surface confronting the semiconductor chip, each of the ball bump electrodes is provided by soldering at the corresponding opening of the cover coating provided for coating the wiring layers. Accordingly, a supply amount of the solder can be stable. Particularly, by using the special punching jig for forming the ball bump electrode, the ball bump electrode can be formed per solder piece.

E. In case of forming the through holes at the organic insulating film or the openings at the adhesive layer by the Ar laser processing, the finer processing can be achieved. Thus, a diameter of the through hole can be reduced, and further, the circumferential wall of the through hole can be vertical. As a result, narrowing of the pitches of the through holes can be achieved.

What is claimed is:

1. A method of manufacturing a semiconductor device which includes a semiconductor chip and a carrier film, said carrier film including an insulating fim and wiring patterns formed on a main surface of said insulating film, said method comprising steps of:

forming an adhesive layer on a surface of a semiconductor wafer having a number of integrated circuits, said integrated circuits each having electrode pads for external connection on said surface of the semiconductor wafer, said adhesive layer being formed over the electrode pads;

forming a first group of openings at regions of said adhesive layer corresponding to said electrode pads;

cutting said semiconductor wafer to obtain said semiconductor chip, said semiconductor chip including one of said integrated circuits;

connecting the electrode pads of said one integrated circuit on said semiconductor chip to said wiring patterns of said carrier film through said first group of openings, respectively; and bonding said semiconductor chip and said carrier film together via said adhesive layer.

2. A method as claimed in claim 1, wherein said first group of openings are formed by etching or laser processing.

3. A method as claimed in claim 1, further including the step, after the step of forming said first group of openings, of providing metal projections or metal ball bumps at said first group of openings, respectively, for electrical connection, said metal projections or said metal ball bumps projecting from said first group of openings.

4. A method as claimed in claim 3, wherein said metal ball bumps are formed of Au added with Pd.

5. A method as claimed in claim 1, wherein said insulating film is provided with through holes for forming conductive passages each for connection between said wiring patterns and said electrode pads or wirings of an external board, said through holes being formed by Ar laser processing and washing processing.

6. A method as claimed in claim 1, wherein said carrier film is provided with said wiring patterns on a surface opposite to another surface which confronts said semiconductor chip, said wiring patterns being coated with a cover coating formed of an insulating material, said cover coating being formed with a second group of openings for connecting said wiring patterns to wirings of an external board, said second group of openings being provided with ball bumps, each formed by punching out a respective solder piece of substantially T-shape in section from solder of a plate shape using a punching jig having a projection at its tip, temporarily jointing said T-shaped solder piece to each of said wiring patterns in each of said second group of openings, and then heating said T-shaped solder piece so as to be formed into a ball shape.

7. A method as claimed in claim 1, wherein a mark for directional matching is formed at a center portion of said carrier film by using said wiring patterns.

8. A method as claimed in claim 1, further including the step, after the step of bonding said semiconductor chip and said carrier film together via said adhesive layer, of coating at least a joint region between said semiconductor chip and said carrier film at a lateral side of a bonded unit of said semiconductor chip and said carrier film with a fluororesin coating material.

9. A method as claimed in claim 7, wherein said mark is in a predetermined shape selected from the group consisting of a circle, a triangle, or other mark capable of identifying a particular direction.

10. A method as claimed in claim 8, wherein said mark is an opening in a wiring layer on said carrier film.

11. A method as claimed in claim 8, wherein said mark is an opening in a wiring layer on said carrier film.

12. A method of manufacturing a semiconductor device comprising a semiconductor chip with electrode pads on a surface thereof and a carrier film, said carrier film including an insulating film and wiring patterns formed on one of main surfaces of said insulating film, said method comprising the steps of:

forming an adhesive layer over an entire area of said surface of the semiconductor chip or on a region of said carrier film corresponding to said entire area of said surface of the semiconductor chip;

forming a first group of openings at regions of said adhesive layer corresponding to said electrode pads;

connecting said electrode pads of said semiconductor chip to said wiring patterns of said carrier film through said first group of openings, respectively; and bonding said semiconductor chip and said carrier film together via said adhesive layer.

13. A method as claimed in claim 12, wherein said first group of openings are formed by etching or laser processing.

14. A method as claimed in claim 12, further including the step, after the step of forming said first group of openings, of providing a metal projection or a metal ball bump at each of said first group of openings for electrical connection, said metal projection or said metal bail bump projecting from each of said first group of openings.

15. A method as claimed in claim 14, wherein said metal ball bump is formed of Au added with Pd.

16. A method as claimed in claim 12, wherein said insulating film is provided with through holes for forming conductive passages each for connection between said wiring patterns and said electrode pads or wirings of an external board, said through holes being formed by Ar laser processing and washing processing.

17. A method as claimed in claim 12, wherein said carrier film is provided with said wiring pattens on a surface opposite to another main surface which confronts said semiconductor chip, said wiring patterns being coated with a cover coating formed of an insulating material, said cover coating being formed with second group of openings for connecting said wiring patterns to wirings of an external board, said second group of openings being provided with ball bumps, each formed by punching out a respective solder piece of a substantially T-shape in section from solder of a plate shape using a punching jig having a projection at its tip, temporarily jointing said T-shaped solder piece to each of said wiring patterns in each of said second group of openings, and then heating said T-shaped solder piece so as to be formed into a ball shape.

18. A method as claimed in claim 12, wherein a mark for directional matching is formed at a center portion of said carrier film by using said wiring patterns.

19. A method as claimed in claim 12, further including the step, after the step of bonding said semiconductor chip and said carrier film together via said adhesive layer, of coating at least a joint region between said semiconductor chip and said carrier film at a lateral side of a bonded unit of said semiconductor chip and said carrier film with a fluororesin coating material.

20. A method as claimed in claim 18, wherein said mark is in a predetermined shape selected from the group consisting of a circle, a triangle, or other mark capable of identifying a particular direction.

* * * * *